United States Patent [19]
Shida et al.

[11] Patent Number: 5,521,517
[45] Date of Patent: May 28, 1996

[54] METHOD AND APPARATUS FOR DETECTING AN IC DEFECT USING A CHARGED PARTICLE BEAM

[75] Inventors: Soichi Shida; Hironobu Niijima, both of Ohra; Hiroshi Kawamoto, Ohsato, all of Japan

[73] Assignee: Advantest Corporation, Tokyo, Japan

[21] Appl. No.: 500,059

[22] Filed: Jul. 10, 1995

[30] Foreign Application Priority Data

Jul. 15, 1994 [JP] Japan .................................. 6-163713

[51] Int. Cl.$^6$ .................................................. G01R 71/26
[52] U.S. Cl. ......................... 324/751; 324/501; 364/579; 250/310
[58] Field of Search ................................... 324/751, 501, 324/701, 538; 250/310; 364/579

[56] References Cited

U.S. PATENT DOCUMENTS 5,404,110  4/1995  Golladay et al. ...................... 324/751

Primary Examiner—Kenneth A. Wieder
Assistant Examiner—Barry C. Bowsel
Attorney, Agent, or Firm—Staas & Halsey

[57] ABSTRACT

The present invention allows to automatically presume a defect location of an IC using an EB tester. Under each of the conditions where a normal power supply voltage and an abnormal power supply voltage are applied to an IC respectively, test patterns are applied to the IC until the pattern address where the first defect is detected by an IC tester. At this point in time, the pattern update is stopped. Then a potential contrast image data is acquired from one of the partitioned segments of the IC surface for each of the above power supply conditions. A diffrence image data between the two potential contrast image data (normal power case and abnormal power case) is generated. This difference image data generation is repeated several times and those defference image data are summed up. A check is made to see if there is a changed portion greater than a predetermined value in each of the segments and if there is, a defect information is stored in a storage portion corresponding to the defect segment. The summed difference image data is acquired from each of all the segments of the IC and then the stop pattern address is decrementsd by one and the same process is repeated. Above process is repeated until no defect segment is detected by decrementing the number of test patterns. When only one segment having a defect is detected, the segment is considered as a real defect segment.

10 Claims, 6 Drawing Sheets

FIG. 5A $309_1$

| $M_1$ | $M_4$ | $M_7$ 「1」 |
|---|---|---|
| $M_2$ | $M_5$ 「1」 | $M_8$ |
| $M_3$ | $M_6$ 「1」 | $M_9$ 「1」 |

FIG. 5B $309_2$

| $M_1$ | $M_4$ | $M_7$ 「1」 |
|---|---|---|
| $M_2$ | $M_5$ 「1」 | $M_8$ |
| $M_3$ | $M_6$ | $M_9$ 「1」 |

FIG. 5C $309_m$

| $M_1$ | $M_4$ | $M_7$ |
|---|---|---|
| $M_2$ | $M_5$ 「1」 | $M_8$ |
| $M_3$ | $M_6$ | $M_9$ |

FIG. 5D $309_{m+1}$

| $M_1$ | $M_4$ | $M_7$ |
|---|---|---|
| $M_2$ | $M_5$ | $M_8$ |
| $M_3$ | $M_6$ | $M_9$ |

METHOD AND APPARATUS FOR DETECTING AN IC DEFECT USING A CHARGED PARTICLE BEAM

BACKGROUND OF THE INVENTION

The present invention relates to a method and an apparatus which irradiate an electron beam, an ion beam or a similar charged particle beam to an IC under test, measure the amount of a secondary electron emission from the irradiated point, display the potential distribution as a potential contrast image and identify defect portions of the IC.

The following test method is proposed in the page 14 (line 23 and below) of U.S. patent application No. 08/337,230 entitled "METHOD AND APPARATUS FOR FORMING A POTENTIAL DISTRIBUTION IMAGE OF A SEMICONDUCTOR INTEGRATED CIRCUIT" filed on Nov. 7, 1994.

After furnishing test patterns from a test pattern generator to drive the IC, the update of the test pattern is stopped. In this condition, an electron beam is irradiated to an area including the circuit wiring portion where an attention is necessary to obtain a potential contrast image data. A series of above operations are carried out under the conditions that a normal power supply voltage (e.g., 5V) is applied to the IC and an abnormal power supply voltage (e.g., 3–4V) is applied to the IC. Then, the difference image data between the potential contrast image data obtained in the normal power supply voltage and the potential contrast image data obtained in the abnormal power supply voltage is generated and a circuit pattern where the two potential contrast images do not match is identified. Then, a defect portion of the IC is presumed based on the mismatch location and the pattern address at which the test pattern was stopped. In this case, after obtaining a plurality of the difference image data, those data are summed so that the image contrast can be intensified. By this summing process, the portion of the circuit wiring pattern where the contrast image data mismatch is intensified to black or white and can easily be pinpointed.

According to this proposed defect detection method, it is difficult to determine how many test patterns (until which pattern address) should be applied to the IC and it is time consuming to pinpoint the circuit wiring portion on the displayed difference image since the portion displayed on a monitor is only a part of the entire IC surface. Also, when the mismatch wiring portions are found in multiple locations, it is not necessarily appropriate to presume those wiring portions as defect portions. In other word, for example, even if the actual defect is in only one location, the mismatch wiring portions of the difference image are detected in multiple locations in the IC as the test patterns are applied in order. Therefore, it is difficult to determine the actual defect point accurately by observing the multiple difference images.

SUMMARY OF THE INVENTION

It is therefore an object of the present invention to provide an IC defect detection method which does not require much workload and can detect a defect location almost automatically.

Another object of the present invention is to provide an apparatus for detecting an IC defect location almost automatically.

According to the method of the present invention; at first step, after applying test patterns to an IC under test under two different operational conditions, a charged particle beam is irradiated to the IC under test to detect a secondary electron emission and two potential contrast image data are obtained. At second step, a difference image data between these two potential contrast image data is generated. At third step, whether or not there is a portion which has a value changed more than predetermined value is determined for each of the segments of the observation surface area of the IC under test partitioned into multiple segments. At fourth step, the number of the test patterns is decremented sequentially from the last test pattern and the first step through the third step are repeated until the number of the segments which have the changed portion becomes one.

Further, after the completion of the fourth step, the number of test patterns is decremented and the first step through the third step are repeated again until the number of segments which have the changed portion becomes zero.

At the first step, two potential contrast image data are observed for each of the segments; at the second step, the difference image data is generated for each of the segments. Or at the first step; two potential contrast image data are observed for the entire surface area of the IC under test; at the second step, the difference image data is generated for the entire surface area.

The first step and the second step are repeated several times for a same test pattern and a plurality of the resulting difference image data are summed up, and then the summed data is used as the difference image data in the third step.

The last address of the first test pattern group in the first step is the test pattern address where the IC under test is tested by an IC tester and the first defect is detected.

In the apparatus of the present invention, a test pattern generator and a charged particle beam tester are provided. When an image data acquisition completion signal is inputted into the test pattern generator, the test pattern generator outputs a signal for switching the operational conditions and at the same time, generates the test patterns again. Each time the signal for switching the operational conditions is furnished, a voltage switching means alternately outputs a normal power supply voltage and an abnormal power supply voltage and a stop pattern address is set in a stop pattern address setting means. If the address of a generated test pattern from the test pattern generator matches the above stop pattern address, a pattern holding means stops an update of the generated test patterns from the test pattern generator and a stop signal is outputted from a stop signal generating means. When a command for changing the number of patterns is furnished to a number of patterns controlling means, the stop pattern address set in the stop pattern setting means is decremented by one. After an IC under test is mounted on the charged particle beam tester, the test patterns from the test pattern generator and a power supply voltage are applied to the IC.

When the stop signal is received, a charged particle beam is irradiated to the IC and acquisition of the potential image data is started. When a potential image data is acquired, an acquisition completion signal is outputted to obtain a difference image data between the potential contrast image data under the normal power supply voltage and the potential contrast image data under the abnormal power supply voltage.

After summing up a plurality of the difference image data and when the summed difference image data are obtained from the entire surface area of the IC, a command for changing the number of test patterns is outputted from a means for changing the number of test patterns and whether or not there are changed portions, which are in the summed difference image data, greater than a predetermined value is determined by a determination means, and then the determination result is stored in a storage means.

BRIEF DESCRIPTION OF THE DRAWINGS

FIGS. 5A through 5D illustrate examples of a mapping of the presence/absence of the operational mismatch portions into each segment.

DETAILED DESCRIPTION OF THE PREFERRED EMBODIMENT

Figure 1:
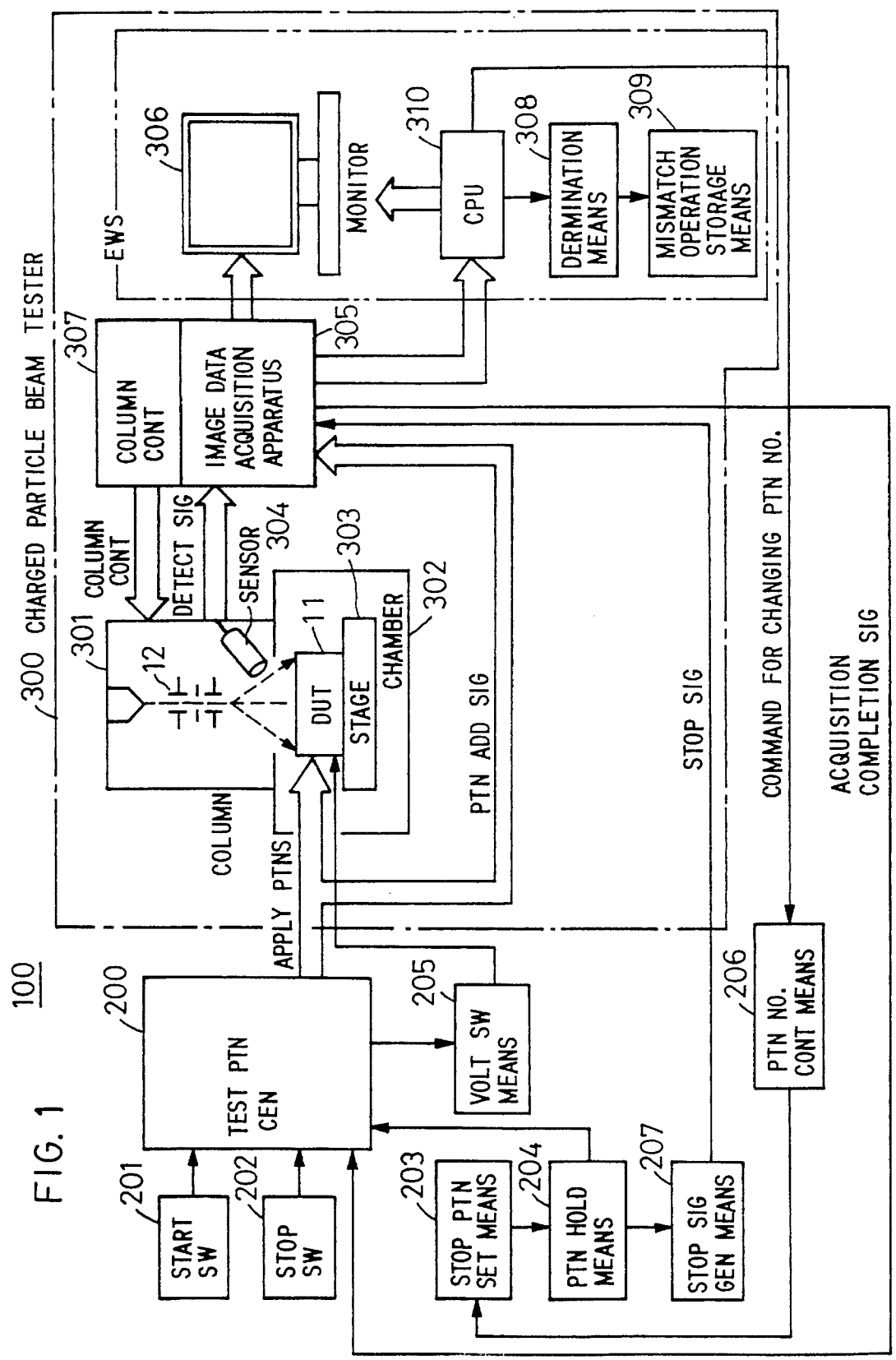
FIG. 1 is a block diagram showing an embodiment of the apparatus in accordance with the present invention.

FIG. 1 shows an example of the embodiment of the method of the present invention. An IC defect detecting apparatus 100 of the present invention comprises a test pattern generator 200 and a charged particle beam tester 300. An electron beam is generally used as the charged particle beam but other charged particle beam such as an ion beam may be used.

The test pattern generator 200 furnishes test pattern signals to an IC under test (referred to as DUT=Device Under Test hereinafter) 11 mounted in the charged particle beam tester 300. The test pattern generator 200 includes a start switch 201 for starting the generation of the test patterns, a stop switch 202 for stopping the generation of the test patterns at any time, a stop pattern setting means 203, a pattern holding means 204 for stopping the test pattern update operations upon the detection of the test pattern of the test pattern address set in the test pattern setting means 203, a voltage switching means 205 for switching the operation voltage being applied to the DUT 11 between the normal 5V and the abnormal 4V every time the test pattern update is stopped and restarted, and a number of patterns controlling means 206 for controlling the number of generated test patterns. In such a configuration, a start control and a stop control of the test pattern signal generation, and a control for stopping the test pattern update at a particular test pattern can be carried out. When the test pattern update operation is stopped by the pattern holding means 204, a stop signal generating means 207 sends a stop signal to the charged particle beam tester 300.

On the other hand, the charged particle beam tester 300 comprises a column 301 for irradiating an electron beam 12 to the DUT 11, a chamber 302 provided under the column 301 in connection with the column 301 for positioning the DUT 11 in the vacuum therein, a stage 303 for moving the DUT 11 in X-Y directions thereon, and a sensor 304 for measuring the amount of a secondary electron emission. Further, every time the test pattern generated by the test pattern generator 200 stops at the set pattern address, a detected electric signal of the sensor 304 corresponding to the potential distribution on the DUT 11 under the condition that the stop test pattern is furnished is taken into an image data acquisition apparatus 305. Then a difference image data between the potential contrast image data obtained under the condition that the normal voltage is applied to the DUT 11 and the potential contrast image data obtained under the condition that the abnormal voltage is applied is generated, and then the difference image data are summed up by the image data acquisition apparatus 305. The potential contrast image data taken into the image data acquisition apparatus 305 and the summed image data are displayed on a monitor 306. The radiation and amount of the radiation (current value) of the electron beam 12, the acceleration voltage, the scanning speed and the scanning area etc. are controlled by a column control 307. Also, a determination means 308 determines if there are portions intensified to black or white from the summed image data generated by the image data acquisition apparatus 305 and the determination result is stored in a mismatch operation storage means 309.

Figure 2:
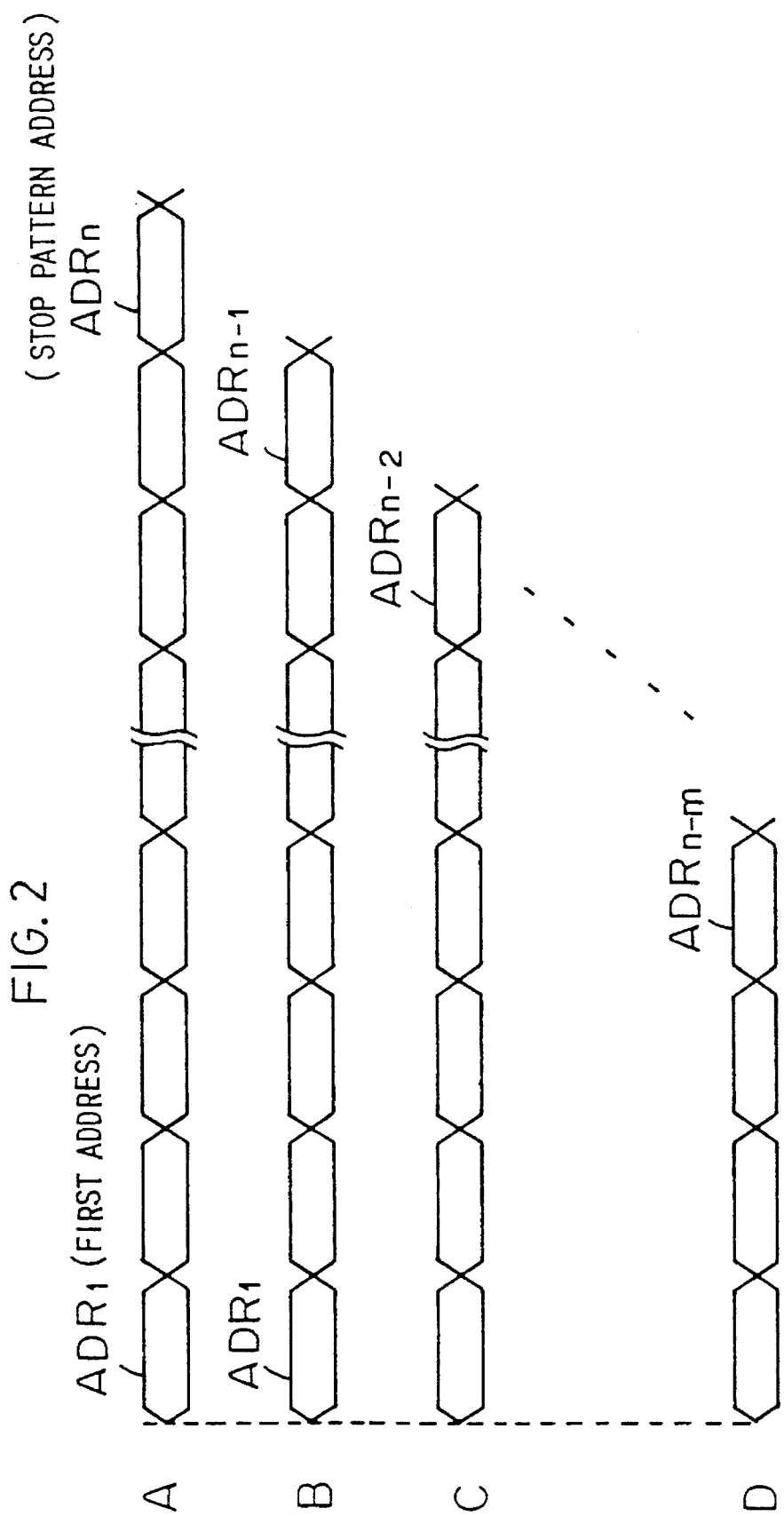
FIG. 2 is a timing diagram showing an example of the change status of the number of test patterns generated in a method of the present invention.

As shown in FIG. 2A, the test pattern generator 200 generates the test patterns starting from a test pattern starting address $ADR_1$ and applies the patterns to drive the DUT 11. The test pattern update operation is stopped by the pattern holding means 204 at a stop pattern address $ADR_n$ set in the stop pattern setting means 203. This stop pattern address $ADR_n$ is dependent on the depth of the logical operations in the DUT 11. When the test pattern update is stopped, a stop signal is sent from stop signal generating means 207 to the charged particle beam tester 300 and the charged particle beam tester 300 measures the potential distribution on the DUT 11 at that time. This measurement is performed for each of a plurality of the partitioned segments of the DUT 11.

Figure 3:
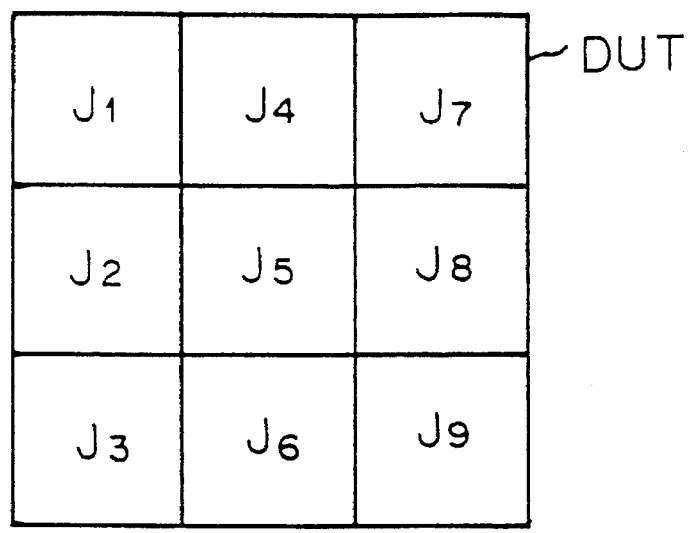
FIG. 3 illustrates an example where an entire surface area of an IC under test is partitioned into a plurality of segments.

In other word, the surface area of the DUT 11 is partitioned into a plurality of segments $J_1$–$J_9$ as shown in FIG. 3 to obtain the potential contrast image data from each of the segments $J_1$–$J_9$ every time the test pattern is stopped. Each of the segments $J_1$–$J_9$ is the area for acquiring the potential contrast image and is generally the maximum area on which an electron beam 12 can scan by a deflection.

When the test pattern is stopped at the stop pattern address ADRn at the first time, the image data acquisition apparatus 305 acquires a first potential contrast image data from the segment $J_1$. Upon the completion of the first potential contrast image data acquisition, the image data acquisition apparatus 305 sends an image data acquisition completion signal to the pattern generator 200 to request for regeneration of the test patterns. After receiving the image data acquisition completion signal, the test pattern generator 200 controls the voltage switching means 205 to switch the power supply voltage for the DUT 11 from the normal 5V to the abnormal 4 V, and generates the test patterns again from the test pattern address $ADR_1$ to ADRn and stops the test pattern update operation again at the test pattern address $ADR_n$. Based on this stop, a stop signal is sent to the charged particle beam tester 300 as in the previous time and the image data acquisition apparatus 305 acquires a second potential contrast image data from the segment $J_1$ and generates a difference image data between the first potential contrast image data and the second potential contrast image data. Incidentally, the image data acquisition apparatus 305 has a memory (not shown) and can store the potential contrast image data and the difference image data of each segment in the memory.

Figure 4:
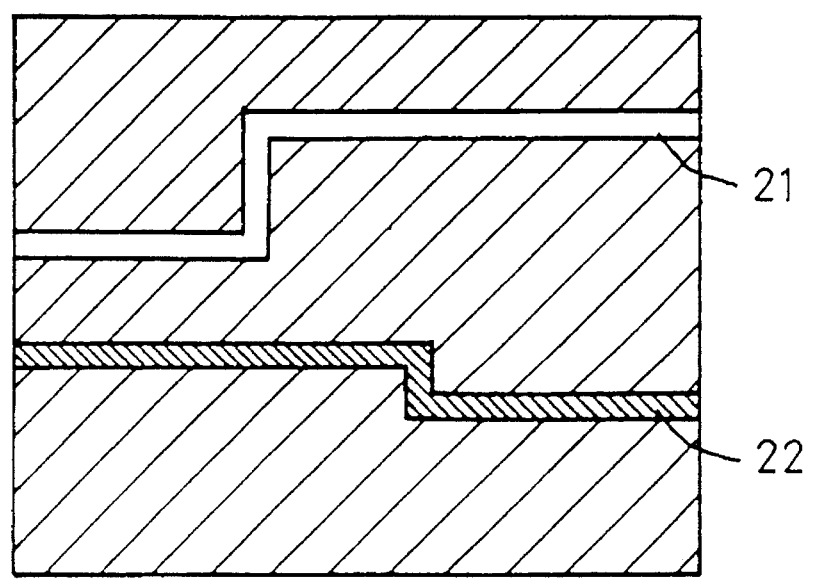
FIG. 4 illustrates differences between two potential contrast image data indicating an operation result in different operational conditions, i.e., an example of a graphic representation of the difference image data.

After the acquisition of the second potential contrast image data, the power supply voltage for the DUT 11 is returned again to the normal 5V, and the test patterns are generated again from the test pattern address $ADR_1$ to $ADR_n$, and the pattern update is stopped at the test pattern address $ADR_n$, and a first potential contrast image data is acquired, and then the power supply voltage is switched to the abnormal 4V to apply the test patterns in a similar manner and the pattern update is stopped to acquire a second potential contrast image data, and again a difference image data between the first potential contrast image data and the second potential contrast image data is generated. These processes are repeated several times and those difference image data are summed up. Thus the mismatch portions of the first and the second potential image data obtained under the different power supply voltages are gradually intensified. Thus, wiring images such as a white pattern 21 and a black pattern 22 are obtained as shown in FIG. 4.

This reason could be explained as follows: The surface of the DUT 11 is covered by an insulator film. When an electron beam is irradiated to the DUT, the insulator film is charged with electricity. Particularly at the wiring portion where the circuit operates normally, the potential becomes the same level every time the test pattern stops and the charge becomes a constant value and a gray color (half tone) is displayed. On the other hand, at the wiring portion where the circuit operates in mismatch corresponding to the different power supply voltages, every time the test pattern stops, the potential is inverted either from high level to low level or from low level to high level and thus, the potential contrast at that portion is intensified every time.

As a result for example, a wiring portion where the first potential contrast image data is high level and the second potential contrast image data is low level is displayed as a white pattern. On the contrary, a wiring portion where the first potential contrast image data is low level and the second potential contrast image data is high level is displayed as a black pattern.

The above process for acquiring the sum of the difference image data is performed for all the segments $J_1$–$J_9$ set on the DUT 11. The segment can be changed by the stage 303 by moving the DUT 11. Every time the sum of the difference image data is acquired from each of the segments $J_1$–$J_9$, the determination means checks the sum of the difference image data to see if there is any intensified portion and stores the result in a mismatch operation storage means 309.

When the sum of the difference image data is acquired from each of all the segments $J_1$–$J_9$ for a stop pattern address $ADR_n$, a control means 310 sends a command for changing the number of test patterns to the means for controlling the number of test patterns 206. The number of test patterns controlling means 206, upon receipt of the command, sends a control command for changing the stop pattern to the previous test pattern address ($ADR_{n-1}$) to the stop pattern setting means 203. Thus, in the consecutive tests, when the test pattern generator 200 outputs the previous pattern address $ADR_{n-1}$ (which is positioned just before the address $ADR_n$), the pattern holding means 204 recognizes this as a stop pattern address and stops the test pattern update operations of the test pattern generator 200. Similarly, the sum of the difference image data is acquired from each of the segments $J_1$–$J_9$ for the stop address $ADR_{n-1}$ and the determination result, whether or not there are intensified portions in the sum of the difference image data, is stored in the mismatch operation storage means 309.

In the similar manner, it is repeated that after the sum of the difference image data is acquired from each of all the segments $J_1$–$J_9$, the stop pattern is changed to the previous test pattern address in the stop pattern setting means 203 and the sum of the difference image data is acquired from each of the segments $J_1$–$J_9$ for the previous test pattern address.

In the mismatch operation storage means 309, maps $309_1, 309_2 \ldots 309_m, 309_{m+1}$ are provided corresponding to the respective stop pattern addresses $ADR_n$, $ADR_{n-1}, \ldots$ as shown in FIGS. 5A, 5B . . . 5D. Each map $309_1$–$309_{m+1}$ has storage parts $M_1$–$M_9$ corresponding to the segments $J_1$–$J_9$ set on the DUT 11. For example, when the stop pattern address is $ADR_n$ and the intensified display portions are detected in the sum of the difference image data acquired from the segments $J_5$, $J_6$, $J_7$ and $J_9$, a logical "1" representing the presence of the mismatch operation is written in each of the storage parts $M_5$, $M_6$, $M_7$ and $M_9$ of the map $309_1$ as shown in FIG. 5A. In the case of the stop pattern address $ADR_{n-1}$, if the intensified display portions are detected in the sum of the difference image data acquired from the segments $J_5$, $J_7$ and $J_9$, a logical "1" is written in each of the storage parts $M_5$, $M_7$ and $M_9$ of the map $309_2$ as shown in FIG. 5B. This process is repeated until any intensified display portion is not detected by the determination means 308 and then, the control means 310 stops the test pattern generation from the test pattern generator 200 to complete the test.

In this example, when the stop pattern address is $ADR_{n-m}$, any of the intensified display portions is not detected in the sum of the difference image data acquired from any of the segment $J_1$–$J_9$ and a logical "1" representing the presence of the mismatch operation is detected in the storage part $M_5$ of the acquired map $309_m$ (FIG. 5C). It could be judged that a real defect portion exists in the segment $J_5$ corresponding to the storage part $M_5$. The reason of this will be explained as below. A mismatch operation occurring at one defect point expands to the surrounding circuits step by step in accordance with the number of the applied test patterns. Therefore, the number of segments where mismatch operations are detected increases as the number of test patterns applied is incremented as shown in FIG. 5A. By decrementing the number of test patterns applied, the number of segments ($J_1$–$J_9$) decreases step by step as shown FIGS. 5A–5D. As the result of decrementing the number of test patterns applied, the final one segment where only one defect portion is detected could be identified. It could be presumed that a real defect does exist in the final one segment. Also the test pattern by which the defect portion is identified can be known based on the stop pattern address.

If a segment where a real defect exists and the associated test pattern are identified, the sum of the difference image data of that segment under that test pattern can be displayed as an image on a monitor 306 and the real defect portion (wiring) can be pinpointed. Also, if a segment including a real defect is identified, the segment can be sub-divided again to search a similar defect point in that segment.

Incidentally, the stop pattern setting means 203, the pattern holding means 204, the number of patterns controlling means 206, and the stop signal generating means 207 are generally constructed in a so called CPU based apparatus. For example, the stop pattern setting means 203 is comprised of digital switches by which an operator sets a stop pattern address $ADR_n$, and the stop pattern address is stored in a RAM or a register by a CPU in a control part of an IC tester and when a command for changing the number of test patterns is inputted, the stored stop pattern address is decremented by 1, and when a test pattern generation is started by the test pattern generator 200, the number of patterns generated is counted by the CPU and then the count value is compared with the stored stop pattern address and if the comparison matches, a stop signal is sent to the test pattern generator 200 and to the charged particle beam tester 300 as well.

In the case for constructing the means 203, 204, 206 and 207 as hardware devices, a counter in which an initial value can manually be set, for example, is used as the stop pattern setting means 203, and a stop pattern address $ADR_n$ is set in this counter as an initial value, and the pattern holding means 204 counts the number of patterns generated by the pattern generator 200 and compares this count value with the value set in the stop pattern setting means, and if matches the pattern holding means sends a stop command to the pattern generator 200 and to the stop signal generating means 207 (e.g., a high logic level is outputted) as well. Also, the number of patterns controlling means 206 may be configured so that the counter in the stop pattern setting means is decremented by 1 when a command for changing the number of patterns is received.

Acquisition of the difference image data between the first and second potential contrast image data and the sum of the difference image data in the image data acquisition apparatus 305 can be performed in the similar manner described in the specification of the above mentioned U.S. patent application Ser. No. 08/337230.

An engineering workstation can be utilized for a monitor 306, a determination means 308, a mismatch operation storage means 309 and a control means 310. In this case, a determination process is performed by the control means (CPU) instead of the determination means 308. However, one of the unique features of the present invention is in this determination process and thus, the determination means 308 is depicted in the drawing (FIG. 1).

Figure 6:
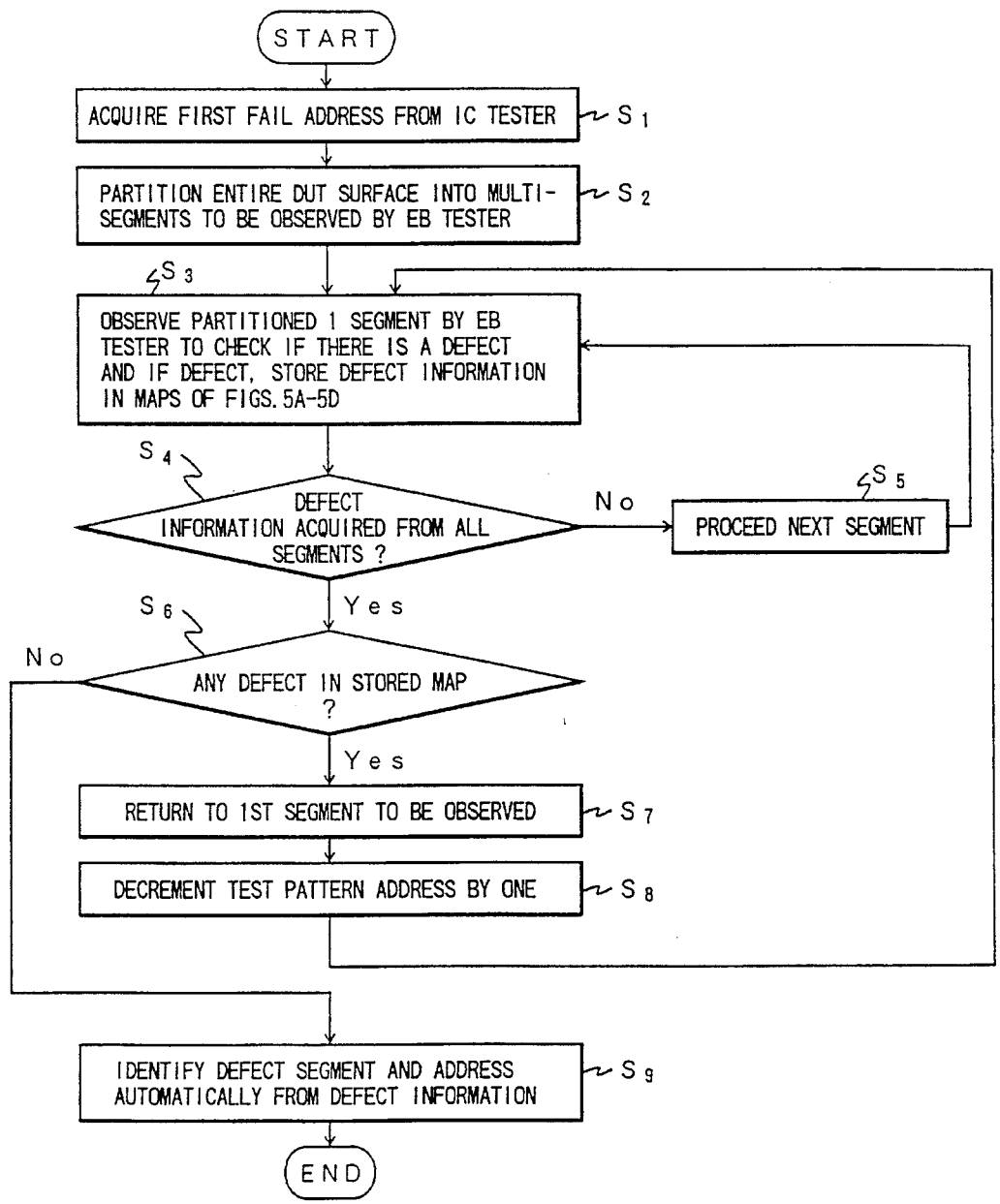
FIG. 6 is a flow chart showing an example of a process sequence of a method of the present invention.
Figure 7:
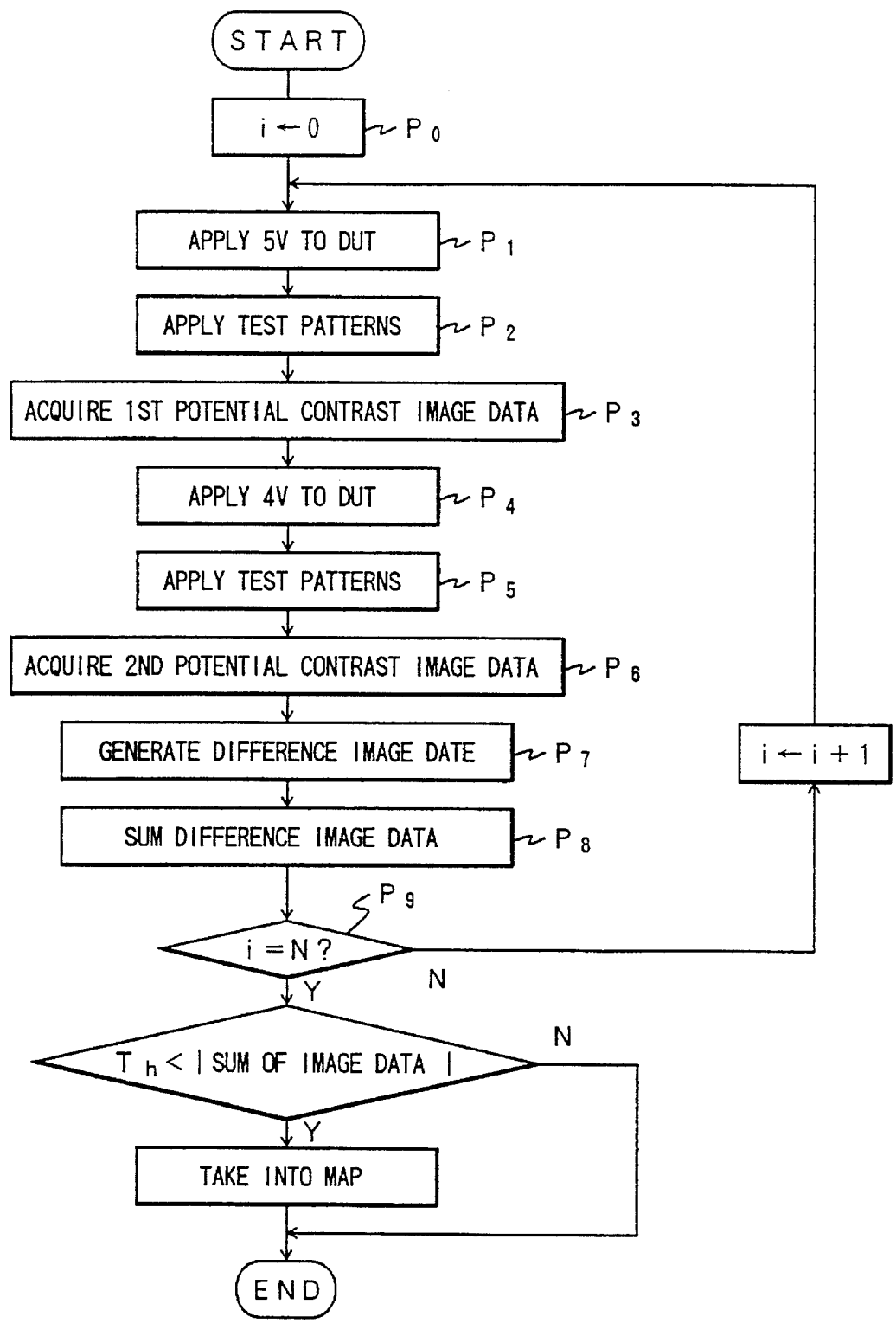
FIG. 7 is a flow chart showing a specific example of the process in step $S_3$ in FIG. 6.

An entire process flow is shown in FIG. 6. This example is the case where the initial stop pattern address $ADR_n$ is obtained from an IC tester. In other word, when test patterns are applied to the DUT, $ADR_n$ is defined as a test pattern address under which a first failure is detected. That is, the first failing address $ADR_n$ is obtained from the IC tester ($S_1$). Then the entire surface area of the DUT is partitioned into a plurality of segments each of which can be observed using an electron beam tester ($S_2$). The first segment is observed using the electron beam tester and the observation result is checked to see if there is a defect portion, in other word, if there is an intensified display portion in the sum of the difference image data, and if there is a defect, the defect information "1" is stored in the corresponding storage part of the corresponding map ($S_3$) shown in FIGS. 5A–5D. The process in step $S_3$ is, for example, as follows as shown in FIG. 7. First, i is initialized to 0 and the normal power supply voltage 5V is applied to the DUT ($P_1$) and then the test patterns are applied to the DUT until a preset stop pattern is applied ($P_2$) and a first potential contrast image data is acquired ($P_3$). Then the power supply voltage is changed to the abnormal 4V ($P_4$) and the test patterns of $P_2$ are applied to the DUT again ($P_5$), and then a second potential contrast image data is acquired ($P_6$). Then a difference image data between the first potential contrast image data and the second potential contrast image data is generated ($P_7$) and this difference image data is added to the accumulated difference image data to obtain a summed image data ($P_8$). Then a check is made to see if i is N ($P_9$) and if i is not N, then 1 is added to i and the process returns to $P_1$ ($P_9$). If i is N in step ($P_9$), then a check is made to see if there is a portion of which absolute value is greater than a threshold value $T_h$ in the sum of the difference image data obtained in step $P_8$ ($P_{10}$) and if there is, a defect information is mapped in the storage means of FIGS. 5A–5D and if not, the process ends.

Returning to FIG. 6, upon completion of the process in step $S_3$, a check is made to see if the defect information is acquired from all the segments under the same test pattern ($S_4$). If acquisition from all the segments is completed, the process proceeds to the next segment and returns to step $S_3$ ($S_5$). In this manner, when the defect information is acquired from all the segments, a check is made to see if there is any defect in the map stored in the mismatch operation storage means 309 ($S_6$). If there is any, the process returns to the first segment ($S_7$) and the stop test pattern address is decremented by 1 and the process returns to step $S_3$ ($S_8$). In such a manner, when it is found that there is no defect in the map created in the mismatch operation storage means 309, a defect segment and the associated test pattern address by which the defect is identified are automatically pointed out ($S_9$).

In the above process, the sum of the difference image data is acquired for each of the segments and the defect determination is performed. However the following process may also be possible. A first potential contrast image data is obtained from the entire surface area of the DUT 11 and then a second potential contrast image data is obtained from the entire surface area of the DUT 11. Then, a difference image data is generated for the entire surface area of the DUT and a sum of the difference image data is obtained for the entire surface of the DUT. Then a command for changing the number of patterns is outputted and then similarly, the sum of the difference image data for the entire surface area of the DUT is divided into the segments. In each of the segments, presence or absence of a changed portion greater than a predetermined value, i.e., a mismatch operation portion, is determined.

Furthermore, in the above process, a first potential contrast image data is acquired by applying the test patterns under the normal power supply voltage for the DUT and a second potential contrast image data is acquired by applying the test patterns under the abnormal power supply voltage for the DUT. However, a similar test could be performed by applying the test patterns to the DUT in the normal speed to obtain a first potential contrast image data and by applying the test patterns to the DUT in the abnormal speed to obtain a second potential contrast image data. In conclusion, the test could be performed by applying the test patterns to the DUT in the different operational conditions to obtain the respective potential contrast image data.

Further, in the above process, the number of test patterns generated is decremented until a mismatch operation portion is not detected from any of the segments to obtain the sum of the difference image data. However, the real defect segment could be presumed by decrementing the number of test patterns until a mismatch operation portion is detected from only one segment and by stopping the following operations to obtain the sum of the difference image data. In this case, the only one segment at that time is considered as the segment having a real defect.

As described above, according to the present invention, all the operations listed below can be automated: acquiring potential contrast image data, the difference image data and the sum of the difference image data, determining if there is any intensified portion in the sum of the difference image data and writing the determination result in the mismatch operation storage means 309. Thus, an IC defect can be detected without any manual handling.

Incidentally, since a segment having a defect can be identified and a location of the wiring pattern indicating the mismatch operation can be pinpointed from the sum of the difference image data in the segment, a name of the defect wiring portion can be retrieved from an IC design CAD data base and also the name can be displayed on a display device.

What is claimed is:

1. A method for detecting an IC defect using a charged particle beam comprising:

a first step for irradiating a charged particle beam to an IC under test to detect a secondary electron emission and to observe two potential contrast image data after applying test patterns to said IC under test in two different operational conditions;

a second step for acquiring a difference image data between said two potential contrast image data;

a third step for determining if there is a changed portion greater than a predetermined value for each segment, said each segment being one of a plurality of segments that an observation surface of said IC under test is partitioned; and a fourth step for decrementing the number of said test patterns from the last pattern to repeat said first step through said third step until the number of segments having said changed portion becomes one.

2. The method for detecting an IC defect as recited in claim 1 further comprising:

a fifth step for decrementing the number of said test patterns until no segment having said changed portion is detected to repeat said first step through said third step.

3. The method for detecting an IC defect as recited in claim 1 wherein in said first step, said two potential contrast image data are observed for each of said segments and in said second step, said difference image data is obtained for each of said segments.

4. The method for detecting an IC defect as recited in claim 1 wherein in said first step, said two potential contrast image data are observed for an entire surface area of said IC under test and in said second step, said difference image data is obtained for said entire surface of said IC under test.

5. The method for detecting an IC defect as recited in claim 1 further comprising:

a sixth step for repeating said first step and said second step predetermined times under the same test pattern, and summing each difference image data obtained in each of said second steps to use the summed difference image data as the difference image data in said third step.

6. The method for detecting an IC defect as recited in claim 3 wherein the size of said segment is selected to be approximately equal to the largest scan square of said charged particle beam.

7. The method for detecting an IC defect as recited in claim 1 wherein said first observation in said first step is performed by applying said test patterns to the IC under test until the test pattern by which the first defect is detected is applied.

8. The method for detecting an IC defect as recited in claim 5 wherein in said first step, said test patterns are generated by a test pattern generator and when an address of one of the test patterns matches a stop pattern address set in a stop pattern setting means, an update of the test patterns being generated by said test pattern generator is stopped and a signal indicating the stop is sent to a charged particle beam tester which performs an irradiation of said charged particle beam, said charged particle beam tester performs an acquisition of said potential contrast image data upon receipt of said signal indicating the stop, and sends an acquisition completion signal to said test pattern generator upon completion of the acquisition of one potential contrast image data, and the test pattern generator changes said operational condition and generates said test patterns again to apply them to said IC under test upon receipt of said acquisition completion signal, said charged particle beam tester sends a command for changing the number of patterns to said test pattern generator when the repeat for predetermined times in said sixth step is completed for all said segments, and said test pattern generator decrements the stop pattern address by one in said stop pattern setting means to change said operational condition and to generate said test patterns.

9. The method for detecting an IC defect as recited claim 8 wherein said operational condition includes a condition where a normal power supply voltage is applied to said IC under test and a condition where an abnormal power supply voltage is applied to said IC under test.

10. An apparatus for detecting an IC defect using a charged particle beam comprising:

a test pattern generator for outputting an operational condition switching signal and for generating test patterns again upon receipt of an acquisition completion signal;

a voltage switching means for outputting a normal power supply voltage and an abnormal power supply voltage alternately every time said operational condition switching signal is received;

a stop pattern setting means where a stop pattern address is set;

a pattern holding means for stopping an update of the test pattern generated from said test pattern generator when an address of the test pattern generated by said test pattern generator matches said stop pattern address set in said stop pattern setting means;

a stop signal generating means for outputting a stop signal when the update of said test pattern is stopped;

a number of patterns controlling means for decrementing the patten address set in said stop pattern setting means by one when a command for changing the number of patterns is received;

means for detecting a secondary electron emission to output a potential contrast image data corresponding to a potential distribution when an IC under test to which the test patterns from said test pattern generator and a power supply voltage from said voltage switching means are applied is mounted and a charged particle beam is irradiated to said IC under test;

an image data acquisition apparatus for generating a difference between said potential contrast image data under the normal power supply voltage and said potential contrast image data under the abnormal power supply voltage, for acquiring a sum of a plurality said difference image data, for starting the acquisition of said potential contrast image data every time said stop signal is received, for sending an acquisition completion signal every time one of said potential contrast image data is obtained, and for sending a command for changing the number of patterns every time said sum of the image data for entire surface area of said IC is acquired;

means for determining if there is a changed portion greater than a predetermined value in said sum of the image data; and storage means for storing the determination result.

* * * * *

UNITED STATES PATENT AND TRADEMARK OFFICE
CERTIFICATE OF CORRECTION

PATENT NO. : 5,521,517
DATED : May 28, 1996
INVENTOR(S) : Soichi SHIDA, et al.

It is certified that error appears in the above-indentified patent and that said Letters Patent is hereby corrected as shown below:

Title Page, [57], Abstract: Line 10, delete "diffrence" and insert therefor --difference--;
       Line 13, delete "deffer" and insert therefor --differ --.
       Line 20, delete "decrementsd" and insert therefor --decrements--.
Column 1, line 65, after "invention", delete the semicolon (";") and insert therefor a comma (",").

Signed and Sealed this

Twentieth Day of August, 1996

Attest:

BRUCE LEHMAN

*Attesting Officer*    *Commissioner of Patents and Trademarks*